US011695333B2

(12) United States Patent
Rentmeister et al.

(10) Patent No.: US 11,695,333 B2
(45) Date of Patent: Jul. 4, 2023

(54) HYBRID SWITCHED CAPACITOR CONVERTERS WITH REAL-TIME CONTROL OF SWITCHING STATE DURATION, AND ASSOCIATED METHODS

(71) Applicant: The Trustees of Dartmouth College, Hanover, NH (US)

(72) Inventors: Jan S. Rentmeister, Norwich, VT (US); Jason T. Stauth, Hanover, NH (US)

(73) Assignee: The Trustees of Dartmouth College, Hanover, NH (US)

( * ) Notice: Subject to any disclaimer, the term of this patent is extended or adjusted under 35 U.S.C. 154(b) by 133 days.

(21) Appl. No.: 17/207,670

(22) Filed: Mar. 20, 2021

(65) Prior Publication Data

US 2021/0296983 A1  Sep. 23, 2021

Related U.S. Application Data

(60) Provisional application No. 62/992,464, filed on Mar. 20, 2020.

(51) Int. Cl.
*H02M 3/07* (2006.01)
*G01R 19/165* (2006.01)
*H02M 1/00* (2006.01)

(52) U.S. Cl.
CPC ........ *H02M 3/07* (2013.01); *G01R 19/16538* (2013.01); *H02M 1/0095* (2021.05); *H02M 1/0025* (2021.05)

(58) Field of Classification Search
CPC .. H02M 1/0095; H02M 3/07; G01R 19/16538
See application file for complete search history.

(56) References Cited

U.S. PATENT DOCUMENTS 9,866,113 B1 * 1/2018 Assaad ................. H02M 3/158
10,720,837 B1 * 7/2020 Agrawal .................... G06F 1/26

OTHER PUBLICATIONS

Kapil Kesarwani, Jason Stauth; Resonant and Multi-Mode Operation of Flying Capacitor Multi-Level DC-DC Converters, IEEE 16th Workshop Control Modeling of Power Electronics, Vancouver, BC, Jul. 15, 2015, pp. 1-8 (Year: 2015).*

* cited by examiner

*Primary Examiner* — Harry R Behm
(74) *Attorney, Agent, or Firm* — Cozen O'Connor

(57) ABSTRACT

A method for controlling a hybrid switched capacitor (SC) converter includes (a) generating control signals for controlling switching devices of the hybrid SC converter, in a manner which regulates one or more parameters of the hybrid SC converter, (b) detecting flying capacitor voltage imbalance in the hybrid SC converter, and (c) in response to detecting flying capacitor voltage imbalance in the hybrid SC converter, generating the control signals in a manner which varies switching state duration of the hybrid SC converter, to move flying capacitor voltage towards balance.

6 Claims, 16 Drawing Sheets

HYBRID SWITCHED CAPACITOR CONVERTERS WITH REAL-TIME CONTROL OF SWITCHING STATE DURATION, AND ASSOCIATED METHODS

RELATED APPLICATIONS

This application claims benefit of priority to U.S. Provisional Patent Application Ser. No. 62/992,464, filed on Mar. 20, 2020, which is incorporated herein by reference.

GOVERNMENT RIGHTS

This invention was made with government support under grant no. ECCS 1711077 awarded by the National Science Foundation. The government has certain rights in the invention.

BACKGROUND

Switching regulators are used in many electronic devices to provide suitable voltage levels for electronic components and subsystems. Due to cost and size restrictions of many systems, there are incentives to build power-efficient switching regulators in small spatial volumes. One class of switching regulator topologies that is receiving increasing attention for these applications is the class of hybrid switched capacitor (SC) converters, which merge some number of switched (or flying) capacitors with one or more inductors.

DETAILED DESCRIPTION OF THE EMBODIMENTS

Figure 1:
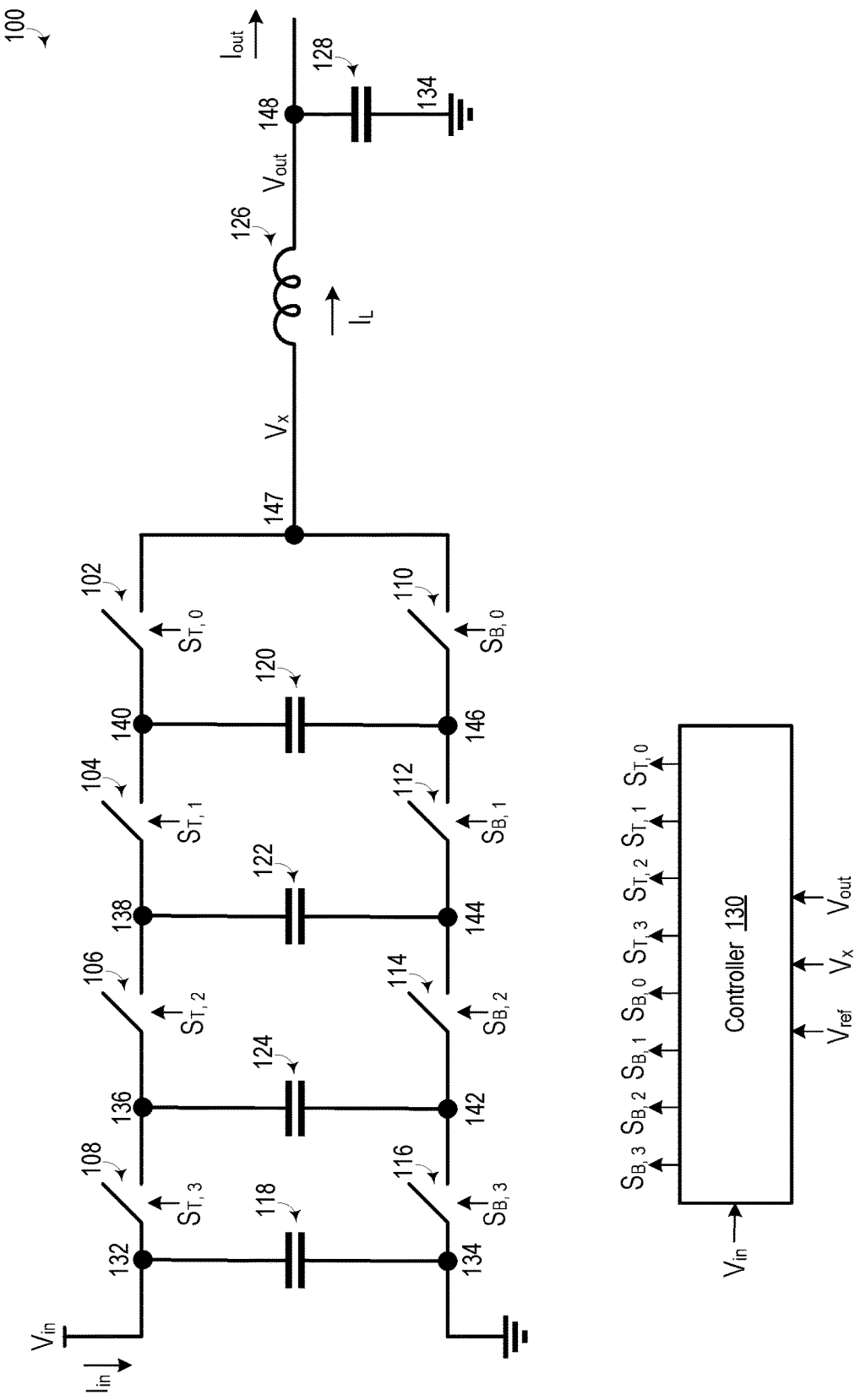
FIG. 1 is a schematic diagram illustrating a hybrid SC converter with real-time control of switching state duration, according to an embodiment.

While hybrid SC converters have advantages over traditional topologies, some challenges exist in guaranteeing desired operation. For example, hybrid SC converters are susceptible to a problem known as (flying) capacitor voltage imbalance, where voltages across flying capacitors deviate from their average or nominal voltages. In this document, the term "flying capacitor voltage" means a voltage across a flying capacitor. Flying capacitor voltage imbalance can increase voltage stress on switching devices, which can reduce system lifetime. Flying capacitor voltage imbalance may also increase current ripple and root-mean-squared (RMS) current in the inductor. Flying capacitor voltage imbalance can be caused by timing inaccuracies and other asymmetries in converter operation such as parasitic impedances. Flying capacitor voltage imbalance can also be caused by fast transient changes of input or output conditions such as input voltage, output voltage, and load current. Flying capacitor voltage imbalance is typically not detectable from a direct current (DC) output voltage of a hybrid-SC converter.

Disclosed herein are hybrid SC converters, associated controllers, and associated methods which at least partially overcome one or more of the aforementioned problems. In some embodiments, a controller for a hybrid SC converter controls duration (length of time) of switching states in which flying capacitors are being charged or discharged by current flowing through an inductor of the hybrid SC converter, to minimize flying capacitor voltage imbalance while maintaining output voltage regulation. For example, if a flying capacitor voltage is too high, the controller increases duration of a switching state in which the flying capacitor is being discharged (discharging switching state), or the controller decreases duration of a switching state in which the flying capacitor is being charged (charging switching state). As another example, if a flying capacitor voltage is too low, the controller increases duration of the charging switching state, or the controller decreases duration of the discharging switching state. In some embodiments, switching state duration is changed in real-time, i.e., on a switching cycle-by-switching cycle basis, to rapidly address flying capacitor voltage imbalance, and to help maintain flying capacitor voltage balance during transient conditions, such as during dynamic line and load conditions. In this document, the term "switching state" means collective operating states of switching devices of a hybrid SC converter. For example, in one hypothetical switching state of a hybrid SC converter, first through third switching devices of the hybrid SC converter are operating in their respective "off" (non-conductive) states, and a fourth switching device of the hybrid SC converter is operating in its "on" (conductive) state. In another hypothetical switching state of the hybrid SC converter, the first switching device is operating in its on state, and the second through fourth switching devices are operating in their respective off states.

In particular embodiments, the controller changes one or more of charging switching state duration and discharging switching state duration using a gain function and measurement of flying capacitor voltage, such as by changing switching state duration according to a deviation of actual flying capacitor voltage from a nominal flying capacitor voltage. Flying capacitor voltage is optionally inferred or estimated, such as by measuring a voltage signal in the hybrid SC converter that is a function of flying capacitor voltage. One example of such a voltage signal is switching node voltage, where the switching node electrically couples the switched-capacitor circuit to an inductor. Switching node voltage is a superposition of one or more flying capacitor voltages in a switching state. In one embodiment, each flying capacitor voltage contributes to the switching node voltage through superposition, such that the measurement and and control action taken on the switching node contributes to the measurement and regulation of flying capacitor voltages. In another embodiment, average switching node voltage is an average of flying capacitor voltages. In a third embodiment switching node voltage is an instantaneous measure of flying capacitor voltage.

In some embodiments, the controller is a hysteretic controller, also referred to as a ripple-injection controller or a sliding mode controller. For example, the controller may include a comparator which detects if a switching state duration is to be increased or decreased based on a comparison of (a) a signal that is function of an average flying capacitor voltage and (b) a reference signal. The signal that is a function of the average flying capacitor voltage is, for example, an integral of flying capacitor voltage across a time interval, or an integral of a switching node voltage across a time interval. An additional comparator is optionally used to set switching state duration based on an absolute voltage level of a flying capacitor voltage (or a switching node voltage). The additional comparator limits switching state duration, for example, when an extreme level of flying capacitor voltage imbalance is detected.

Certain embodiments of the controller use a combination of the aforementioned techniques to control switching state duration. For example, certain controller embodiments determine switching state duration based on at least one or more of the following:

(a) a first output signal of a first comparator which compares (1) a first reference voltage to (2) a sum of output voltage and a signal representing inductor current ripple;

(b) a second output signal of a second comparator which compares (1) a second reference voltage to (2) an integral of a switching node voltage, to detect if flying capacitor voltage is above or below a nominal (desired) voltage level; and (c) a third output signal of a third comparator which compares (1) a third reference voltage to (2) an absolute voltage level of the switching node voltage, to rapidly detect an excessive level of flying capacitor voltage imbalance without integration delay.

The controller uses the first output signal, for example, to trigger a switching state end, and the controller may use one or more of the second and third output signals to control switching state duration. However, the controller may use one or more of the first, second, and third output signals in other manners without departing from the scope hereof.

FIG. 1 is a schematic diagram illustrating a hybrid SC converter 100, which is one embodiment of the new hybrid SC converters with real-time control of switching state duration. Hybrid SC converter 100 includes upper switching devices 102, 104, 106 and 108, lower switching devices 110, 112, 114, and 116, an input capacitor 118, flying capacitors 120, 122, 124, an inductor 126, an output capacitor 128, and a controller 130. Hybrid SC converter 100 is a four-cell converter, i.e. it has four pairs of switches, where each switch pair includes a respective upper switching device and a respective lower switching device. For example, a first cell of hybrid SC converter 100 includes upper switching device 102 and lower switching device 110, and a second cell of hybrid SC converter 100 includes an upper switching device 104 and a lower switching device 112. However, hybrid SC converter 100 could be modified to have a different number of switching devices and associated flying capacitors, e.g. to realize a different number of cells, without departing from the scope hereof. For example, upper switching device 108, flying capacitor 124, and lower switching device 116 could be omitted so that hybrid SC converter 100 is a three-cell hybrid SC converter.

Input capacitor 118 is electrically coupled between an input power node 132 and a reference node 134. Upper switching device 108 is electrically coupled between input power node 132 and an upper node 136, and upper switching device 106 is electrically coupled between upper node 136 and an upper node 138. Upper switching device 104 is electrically coupled between upper node 138 and an upper node 140, and upper switching device 102 is electrically coupled between upper node 140 and a switching node 147. Lower switching device 116 is electrically coupled between reference node 134 and a lower node 142, and lower switching device 114 is electrically coupled between lower node 142 and a lower node 144. Lower switching device 112 is electrically coupled between lower node 144 and a lower node 146, and lower switching device 110 is electrically coupled between lower node 146 and switching node 147.

Flying capacitor 120 is electrically coupled between upper node 140 and lower node 146, and flying capacitor 122 is electrically coupled between upper node 138 and lower node 144. Flying capacitor 124 is electrically coupled between upper node 136 and lower node 142. Thus, each flying capacitor is electrically coupled between a respective pair of the upper switching devices and a respective pair of the lower switching devices. For example, flying capacitor 120 is electrically coupled between pair of upper switching devices 102/104 and pair of lower switching devices 110/112. Inductor 126 is electrically coupled between switching node 147 and an output power node 148. Output capacitor 128 is electrically coupled between output power node 148 and reference node 134. A load (not shown) is optionally electrically coupled to output power node 148; the load receives output current $I_{out}$ at output voltage $V_{out}$. An input electrical power source (not shown) is optionally electrically coupled to input power node 132.

In some embodiments, each of upper switching devices 102-108 and each of lower switching devices 110-116 includes one or more transistors, such as a field effect transistor (FET) or a bipolar junction transistor (BJT). Upper switching devices 102, 104, 106, and 108 are controlled by control signals $S_{T,0}$, $S_{T,1}$, $S_{T,2}$, and $S_{T,3}$, respectively. Lower switching devices 110, 112, 114, and 116 are controlled by control signals $S_{B,0}$, $S_{B,1}$, $S_{B,2}$, and $S_{B,3}$, respectively. One or more of upper switching devices 102-108 and lower switching devices 110-116 optionally includes driver circuitry (not shown), such as to level-shift a control signal to a level suitable for driving a transistor gate or base.

Figure 2:
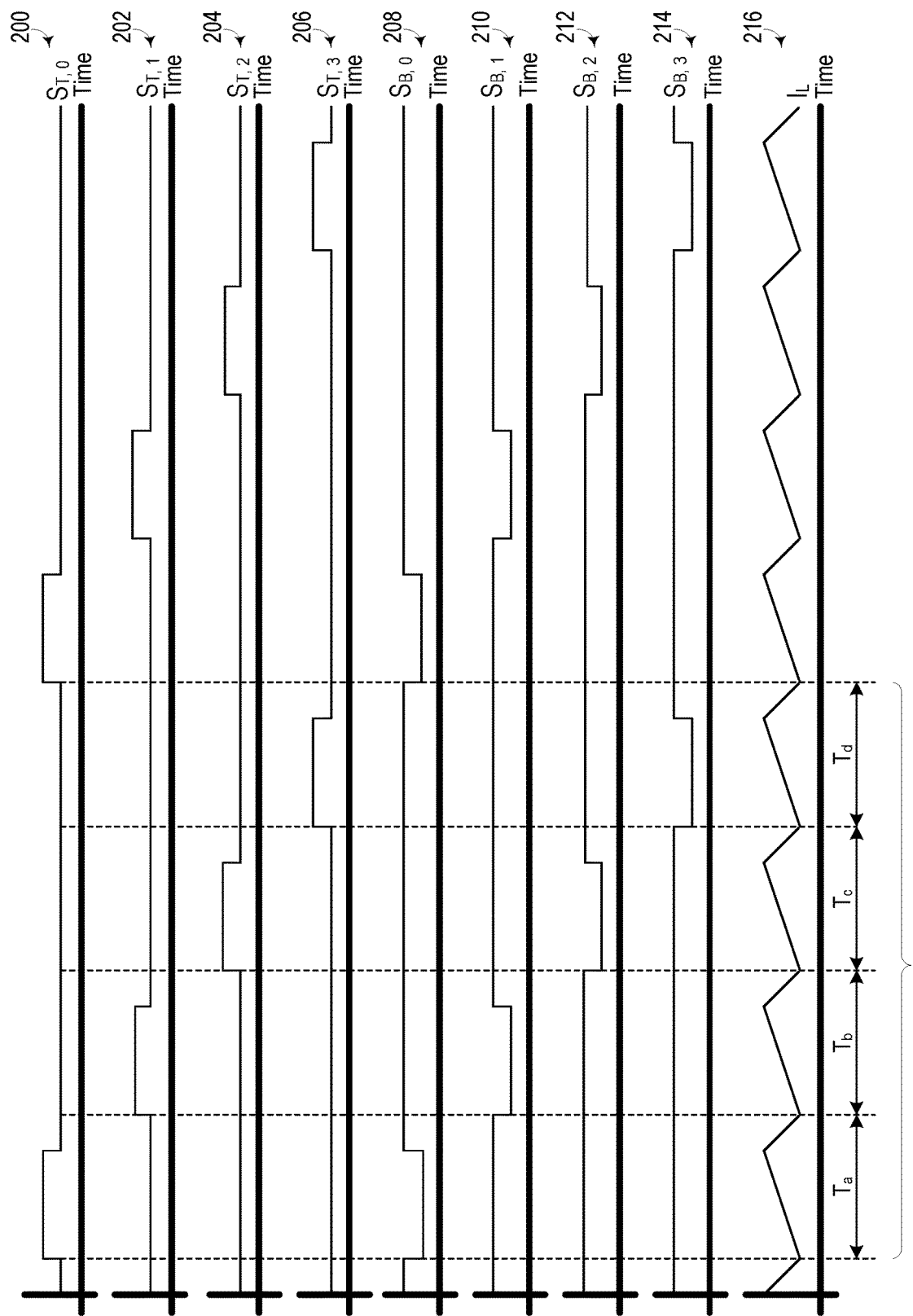
FIG. 2 includes nine graphs illustrating example control signals in the hybrid SC converter of FIG. 1.

Controller 130 generates control signals $S_{T,0}$, $S_{T,1}$, $S_{T,2}$, $S_{T,3}$, $S_{B,0}$, $S_{B,1}$, $S_{B,2}$, and $S_{B,3}$. Controller 130 generates control signals $S_{B,0}$, $S_{B,1}$, $S_{B,2}$, and $S_{B,3}$ such that they are complementary to control signals $S_{T,0}$, $S_{T,1}$, $S_{T,2}$, and $S_{T,3}$, respectively, although there may be deadtime between switching states where complementary switching devices are in their off-states, to prevent undesired simultaneous conduction of complementary switching devices. Additionally, controller 130 sequentially asserts control signals $S_{T,0}$, $S_{T,1}$, $S_{T,2}$, that $S_{T,3}$ such that only one of these control signals is asserted at a given time. In some embodiments, controller 130 controls assertion duration of control signals $S_{T,0}$, $S_{T,1}$, $S_{T,2}$, and $S_{T,3}$ to regulate one or more parameters of hybrid SC converter 100, e.g., output voltage $V_{out}$, input voltage $V_{in}$, output current $I_{out}$, or input current $I_{in}$. FIG. 2 includes graphs 200-214 illustrating examples of control signals $S_{T,0}$, $S_{T,1}$, $S_{T,2}$, $S_{T,3}$, $S_{B,0}$, $S_{B,1}$, $S_{B,2}$, and $S_{B,3}$, respectively. FIG. 2 also includes a graph 216 illustrating an example of current $I_L$ through inductor 126. In the FIG. 2 graphs, the horizontal axes represent time, and the vertical axes represent magnitude. In the example of FIG. 2, controller 130 asserts control signals for switching devices in the following repeating sequence 218: (a) controller 130 asserts control signal $S_{T,0}$ in a switching cycle $T_a$, (b) controller 130 asserts control signal $S_{T,1}$, in a switching cycle $T_b$, (c) controller 130 asserts control signal $S_{T,2}$, in a switching cycle $T_c$, and (d) controller 130 asserts control signal $S_{T,3}$ in a switching cycle $T_d$. However, controller 130 could be configured to assert control signals $S_{T,0}$, $S_{T,1}$, $S_{T,2}$, and $S_{T,3}$ in a different sequence. Additionally, while control signals are shown in FIG. 2 as being asserted when in a logic-high state, controller 130 could be configured to generate control signals having a different polarity or form.

Referring again to FIG. 1, in some embodiments, controller 130 is configured to generate control signals $S_{T,0}$, $S_{T,1}$, $S_{T,2}$, $S_{T,3}$, $S_{B,0}$, $S_{B,1}$, $S_{B,2}$, and $S_{B,3}$ to control switching state duration in real-time, i.e. on a switching cycle-by-switching cycle basis, such as to help minimize flying capacitor voltage imbalance. For example, in certain embodiments, controller 130 is configured to generate control signals $S_{T,0}$, $S_{T,1}$, $S_{T,2}$, $S_{T,3}$, $S_{B,0}$, $S_{B,1}$, $S_{B,2}$, and $S_{B,3}$ to perform one or more of the following control techniques on a switching cycle-by-switching cycle basis: (a) increase a duration of a discharging switching state in response to a flying capacitor voltage being too high, (b) decrease a duration of a charging switching state in response to a flying capacitor voltage being too high, (c) increase a duration of a charging switching state in response to a flying capacitor voltage being too low, and (d) decrease duration of a discharging switching state in response to a flying capacitor voltage being too low.

Figure 3:
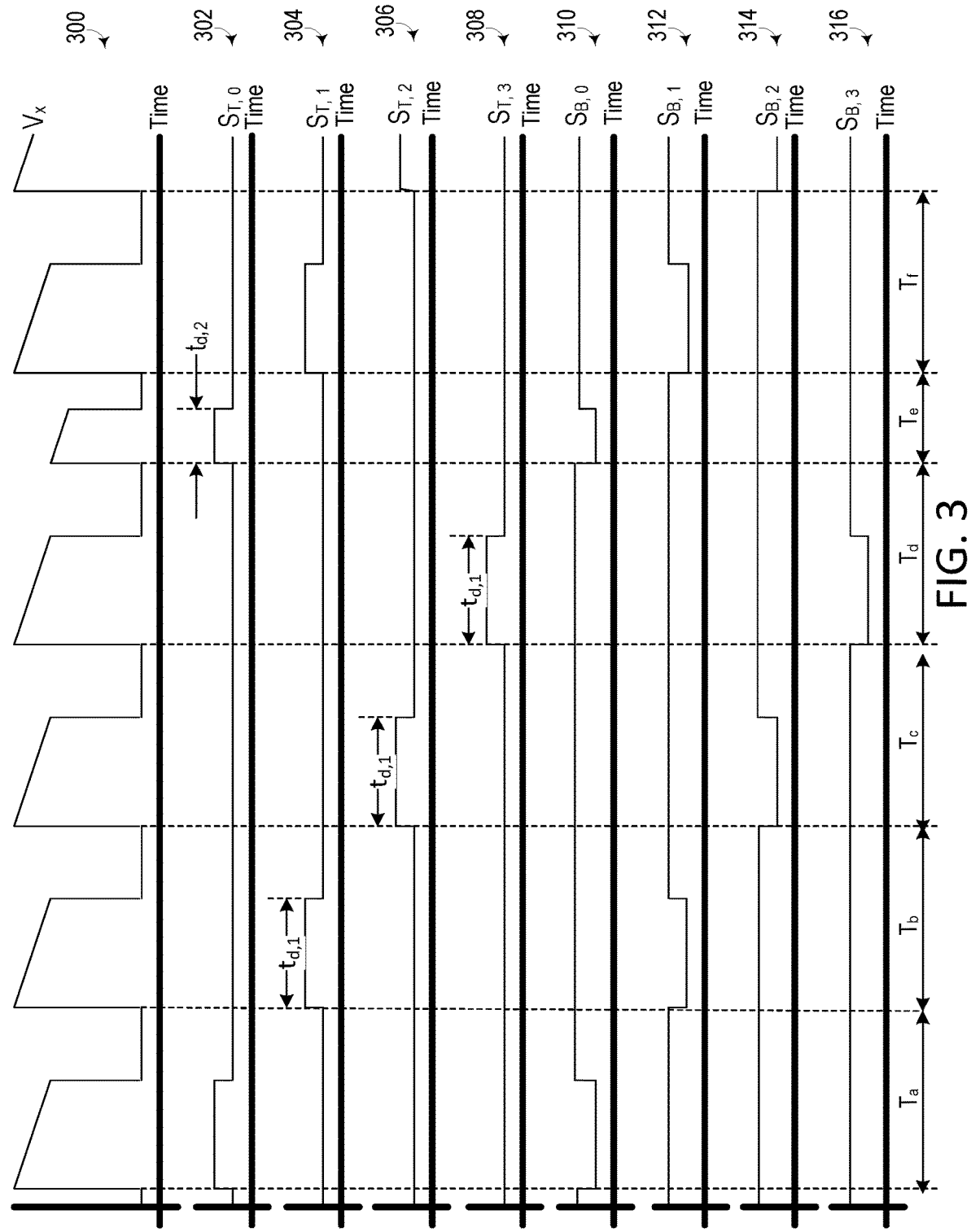
FIG. 3 includes nine graphs illustrating one example of a controller of the FIG. 1 hybrid SC converter correcting for flying capacitor voltage imbalance by decreasing a switching state duration.
Figure 4:
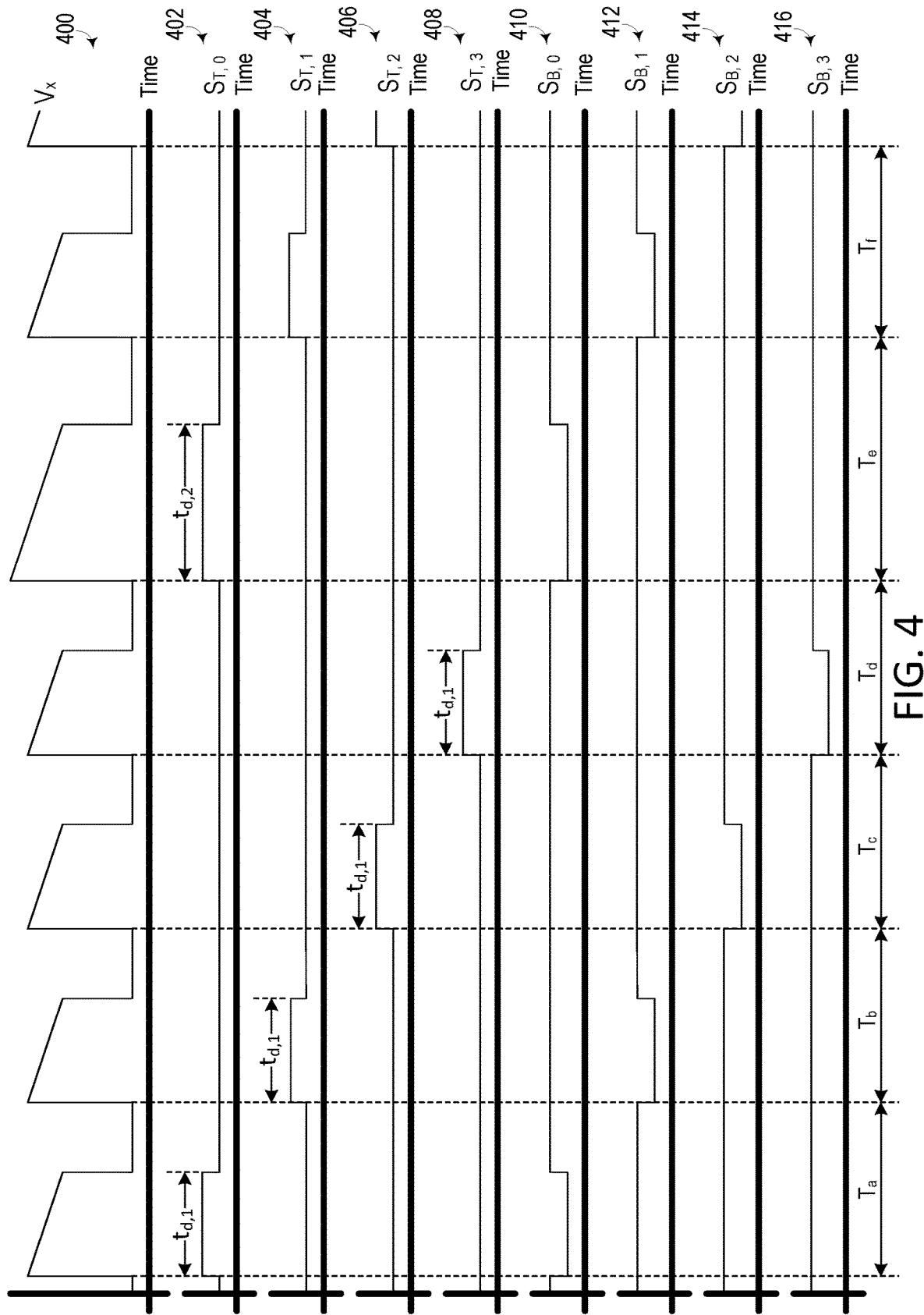
FIG. 4 includes nine graphs illustrating one example of a controller of the FIG. 1 hybrid SC converter correcting for flying capacitor voltage imbalance by increasing switching state duration.

Discussed below with respect to FIGS. 3 and 4 are two examples of controller 130 controlling switching state duration to help minimize flying capacitor voltage imbalance. It is understood, however, that controller 130 need not be configured to execute the techniques illustrated in each of FIGS. 3 and 4. For example, some embodiments of controller 130 are configured to minimize flying capacitor voltage imbalance solely by decreasing switching state duration, such as illustrated in FIG. 3.

FIG. 3 includes graphs illustrating one example of controller 130 correcting for flying capacitor voltage imbalance by decreasing a duration of a switching state. FIG. 3 includes a graph 300 representing magnitude of voltage $V_x$ at switching node 147 as a function of time, along with graphs 302-316 respectively representing magnitude of each of control signals $S_{T,0}$, $S_{T,1}$, $S_{T,2}$, $S_{T,3}$, $S_{B,0}$, $S_{B,1}$, $S_{B,2}$, and $S_{B,3}$ as a function of time. Flying capacitor voltage is balanced in switching cycles $T_a$, $T_b$, $T_c$, and $T_d$, as evident from switching node voltage $V_x$ being the same in each of these switching cycles. Accordingly, each of control signals $S_{T,0}$, $S_{T,1}$, $S_{T,2}$, and $S_{T,3}$ is respectively asserted for a common duration $t_{d,1}$, in switching cycles $T_a$, $T_b$, $T_c$, and $T_d$. However, the switching node voltage subsequently drops below a nominal value, as evident by switching node voltage $V_x$ being lower in switching cycle $T_e$, resulting in flying capacitor voltage imbalance. In response, controller 130 decreases an assertion duration of control signal $S_{T,0}$ from $t_{d,1}$ to $t_{d,2}$ in switching cycle $T_e$, where $t_{d,2}$ is less than $t_{d,1}$, thereby decreasing switching state duration. Consequently, switching node voltage $V_x$ decreases less than in other switching states, thereby promoting flying capacitor voltage balance. An assertion duration of lower switching device control signals $S_{B,0}$, $S_{B,1}$, $S_{B,2}$, and $S_{B,3}$ is also reduced in switching cycle $T_e$, to help maintain regulation of output voltage $V_{out}$. Accordingly, in the example of FIG. 3, controller 130 reduces switching state duration in switching cycle $T_e$ to help eliminate flying capacitor voltage imbalance.

FIG. 4 includes graphs illustrating one example of controller 130 correcting for flying capacitor voltage imbalance by increasing switching state duration. FIG. 4 includes a graph 400 representing magnitude of voltage $V_x$ at switching node 147 as a function of time, along with graphs 402-416 respectively representing magnitude of each of control signals $S_{T,0}$, $S_{T,1}$, $S_{T,2}$, $S_{T,3}$, $S_{B,0}$, $S_{B,1}$, $S_{B,2}$, and $S_{B,3}$ as a function of time. Flying capacitor voltage is balanced in switching cycles $T_a$, $T_b$, $T_c$, and $T_d$, as evident from switching node voltage $V_x$ being the same in each of these switching cycles. Accordingly, each of control signals $S_{TA}$, $S_{T,1}$, $S_{T,2}$, and $S_{T,3}$ is respectively asserted for a common duration $t_{d,1}$, in switching cycles $T_a$, $T_b$, $T_c$, and $T_d$. However, switching node voltage $V_x$ subsequently rises above a nominal value, as evident by switching node voltage $V_x$ being higher in switching cycle $T_e$, resulting in flying capacitor voltage imbalance. In response, controller 130 increases an assertion duration of control signal $S_{T,0}$ from $t_{d,1}$ to $t_{d,2}$ in switching cycle $T_e$, where $t_{d,2}$ is greater than $t_{d,1}$, thereby increasing switching state duration. Consequently, the switching node voltage decreases, thereby promoting flying capacitor voltage balance. An assertion duration of lower switching device controls signals $S_{B,0}$, $S_{B,1}$, $S_{B,2}$, and $S_{B,3}$ is also increased in switching cycle $T_e$, to help maintain regulation of output voltage $V_{out}$. Accordingly, in the example of FIG. 4, controller 130 increases switching state duration during switching cycle $T_e$ to help eliminate flying capacitor voltage imbalance.

Figure 5:
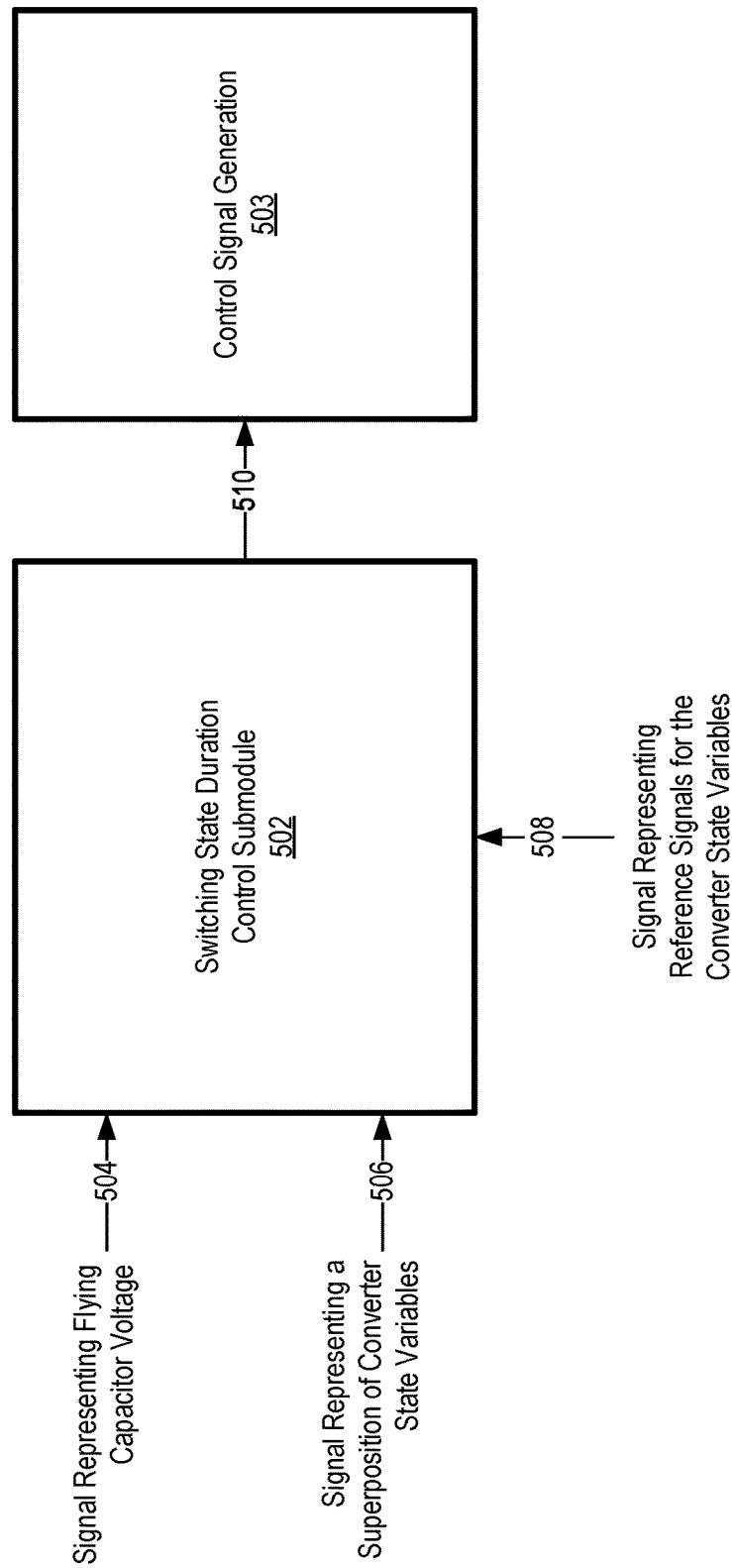
FIG. 5 is a block diagram of one embodiment of a controller of the FIG. 1 hybrid SC converter.

FIG. 5 is a block diagram of a controller 500, which is one possible embodiment of controller 130 of FIG. 1, although it is understood that controller 130 could be embodied in other manners without departing from the scope hereof. Controller 500 includes a switching state duration control submodule 502, hereinafter submodule 502, as well as a control signal generation block 503. Submodule 502 controls switching state duration on a switching cycle-by-switching cycle basis, to help minimize flying capacitor voltage imbalance. Submodule 502 receives at least signals 504, 506, and 508. Signal 504 represents voltage across at least one flying capacitor, e.g., voltage across flying capacitor 120, voltage across flying capacitor 122, and/or voltage across flying capacitor 124. Signal 504 is obtained, for example, by directly sensing flying capacitor voltage or by inferring flying capacitor voltage from another parameter, such as switching node voltage $V_x$. Signal 506 represents a superposition of converter state variables, such as one or more of converter output voltage $V_{out}$, inductor current $I_L$, output current $I_{out}$, input current $I_{in}$, and input voltage $V_{in}$.

Signal 508 represents reference signals for the converter state variables represented by signal 506, e.g., desired converter output voltage.

Submodule 502 is configured to generate switching state transition signal 510 setting on/off state of switching devices 102-116, e.g., causing one or more the switching devices to change respective operating state, based at least in part on signals 504-508, thereby controlling switching state duration, such that (a) more charge is transferred out of a connected flying capacitor if its voltage is too large, e.g., its voltage is greater than a first threshold value, and/or (b) less charge is transferred out of the connected flying capacitor if its voltage is too small, e.g., its voltage is less than a second threshold value, where the first and second threshold values are the same or are different. Control signal generation block 503 generates control signals $S_{B,0}$, $S_{B,1}$, $S_{B,2}$, and $S_{B,3}$ such that they are complementary to control signals $S_{T,0}$, $S_{T,1}$, $S_{T,2}$, and $S_{T,3}$, respectively, although there may be deadtime during switching state transitions, as discussed above. Additionally, control signal generation block 503 sequentially asserts control signals $S_{T,0}$, $S_{T,1}$, $S_{T,2}$, that $S_{T,3}$ such that only one of these control signals is asserted at a given time, such as in the manner illustrated in FIG. 2. Furthermore, control signal generation block 503 changes assertion duration of one more controls signals $S_{T,0}$, $S_{T,1}$, $S_{T,2}$, $S_{T,3}$, $S_{B,0}$, $S_{B,1}$, $S_{B,2}$, and $S_{B,3}$ in accordance with switching state transition signal 510. For example, if submodule 502 asserts signal 510 indicating that a switching state duration should be increased or decreased to move flying capacitor voltage toward balance, control signal generation block 503 changes the state of one or more control signals $S_{T,0}$, $S_{T,1}$, $S_{T,2}$, $S_{T,3}$, $S_{B,0}$, $S_{B,1}$, $S_{B,2}$, and $S_{B,3}$ accordingly.

Figure 6:
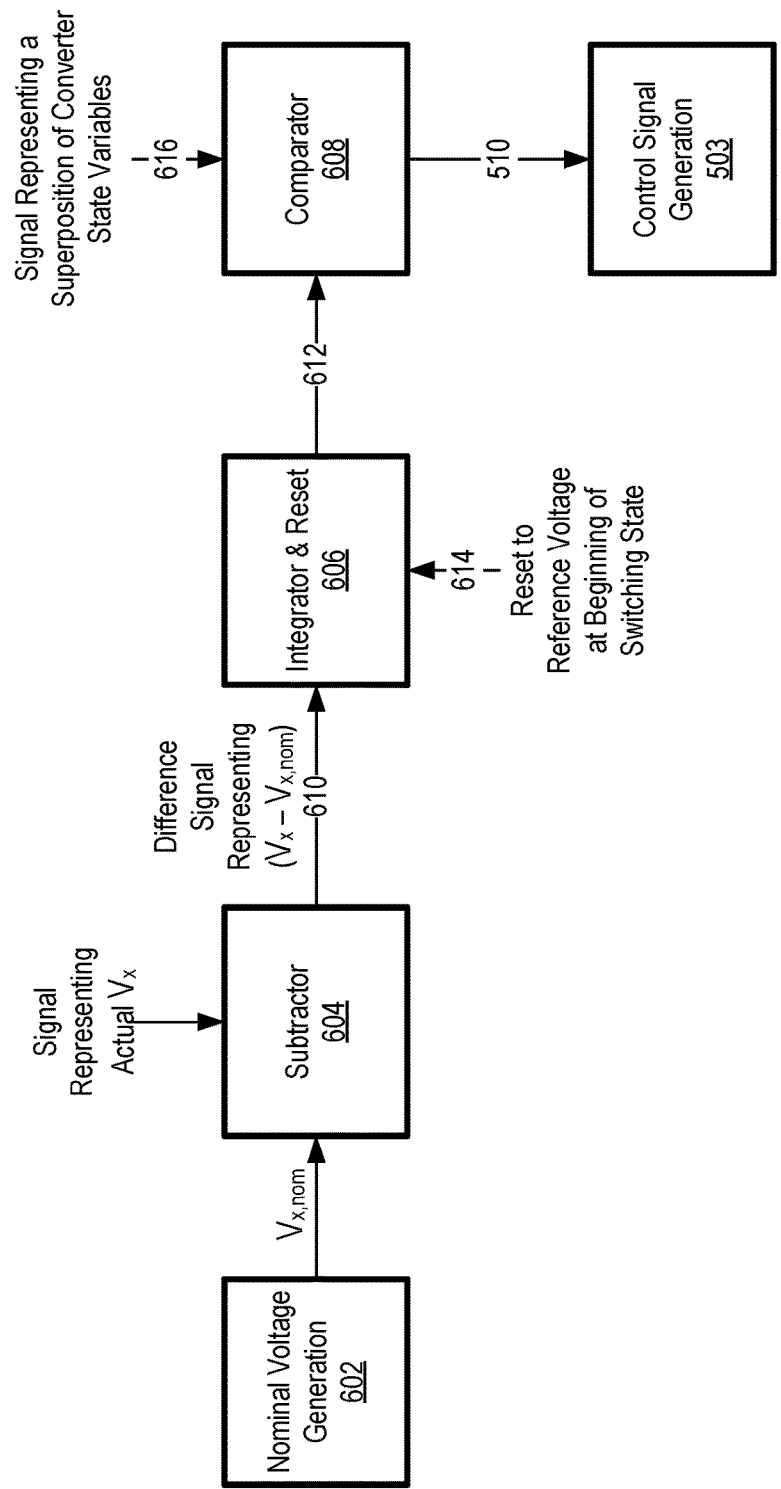
FIG. 6 is a block diagram of one possible implementation of the FIG. 5 controller, according to an embodiment.

FIG. 6 is a block diagram of a controller 600, which is one possible embodiment of controller 500 of FIG. 5. Controller 600 includes a nominal voltage generation block 602, a subtractor block 604, an integrator and reset block 606, a comparator block 608, and an instance of control signal generation block 503. Nominal voltage generation block 602 generates a signal $V_{x,nom}$ representing a nominal or expected value of switching node voltage $V_x$. In some embodiments, signal $V_{x,nom}$ is generated from input voltage $V_{in}$ or from a reference voltage, such as by dividing down voltage $V_{in}$ using a voltage divider, or from sampling or sensing a reference voltage. In some other embodiments, signal $V_{x,nom}$ is generated by determining an average value of switching node voltage $V_x$ when switching node 147 is driven high, across a plurality of switching cycles. Subtractor block 604 subtracts signal $V_{x,nom}$ from the signal representing actual switching node voltage $V_x$ to yield a difference signal 610 representing $V_x$-$V_{x,nom}$. In some alternate embodiments, difference signal 610 represents $V_{x,nom}$-$V_x$. Integrator and reset block 606 generates a signal 612, which is an integral of difference signal 610 over the time of a switching cycle, added to an output reference voltage 614 at the beginning of the switching cycle.

Comparator block 608 compares signal 612 to a signal 616 representing a superposition of converter state variables, e.g., converter output voltage plus one or more additional state variables, such as alternating current (AC) flowing through inductor 126. Signal 616 and/or signal 612 may also include a hysteresis component. Comparator 608 asserts switching state transition signal 510 in response to a value of signal 612 crossing a value of signal 616. In an alternate embodiment, signal 612 does not include output reference voltage 614, and signal 616 is instead adjusted according to output reference voltage 614, e.g., output reference voltage 614 is subtracted from the superposition of state variables. Control signal generation block 503 generates control signals in accordance with switching state transition signal 510, in a manner like that discussed above with respect to FIG. 5.

Figure 7:
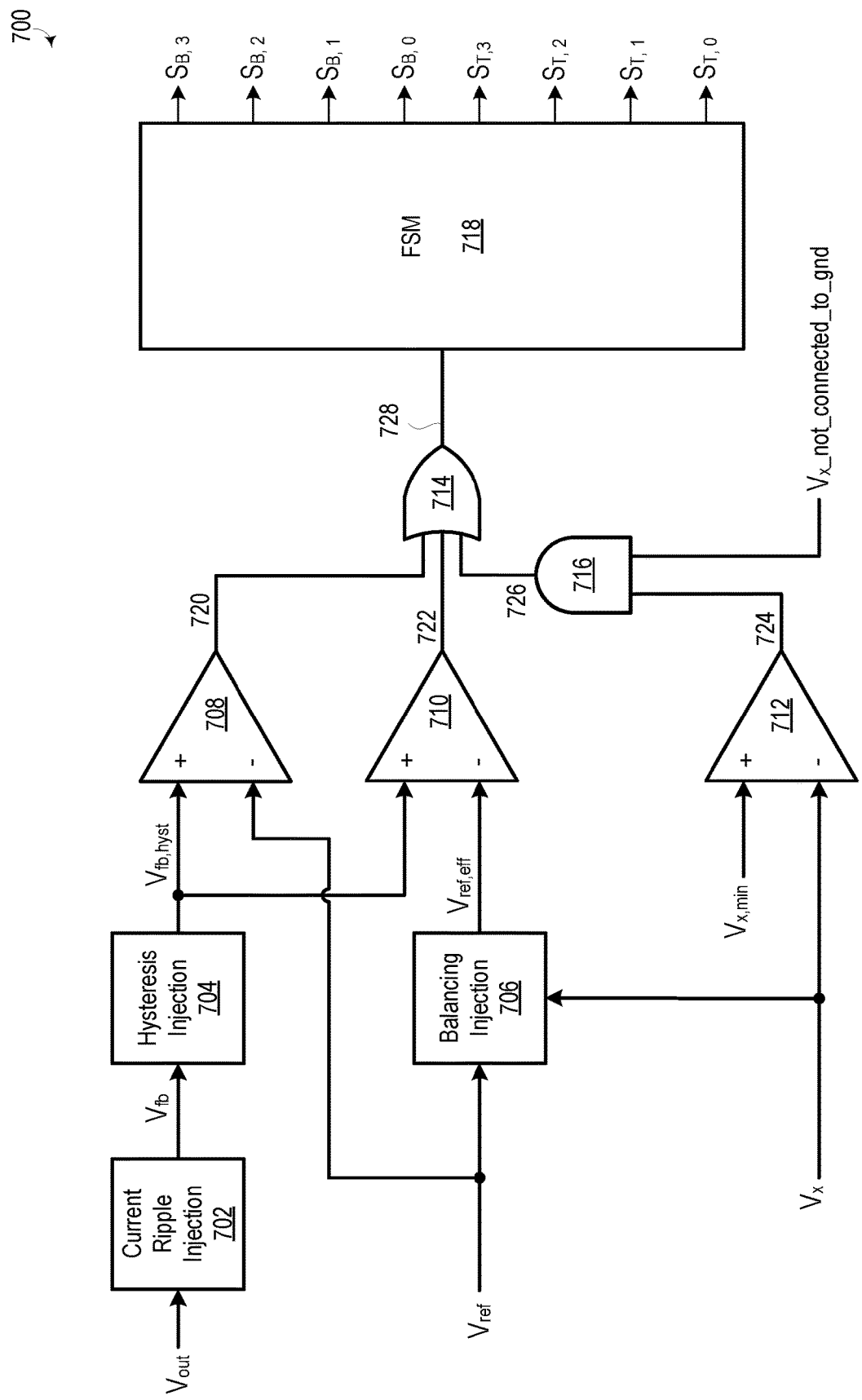
FIG. 7 is a schematic diagram of one embodiment of the FIG. 6 controller.

FIG. 7 is a schematic diagram of a controller 700, which is one embodiment of controller 600 of FIG. 6. Controller 700 includes a current ripple injection subsystem 702, a hysteresis injection subsystem 704, a balancing injection subsystem 706, comparators 708, 710, and 712, an AND gate 716, an OR gate 714, and a finite state machine (FSM) 718. The elements of controller 700 are formed, for example, of analog electronic circuitry and/or digital electronic circuitry. Two or more of the elements of controller 700 could be combined without departing from the scope hereof.

Current ripple injection subsystem 702 is configured to inject a signal representing current $I_L$ through inductor 126 (FIG. 1) onto a signal representing output voltage $V_{out}$ to yield a signal $V_{fb}$. Hysteresis injection subsystem 704 is configured to inject a hysteresis component onto signal $V_{fb}$ to obtain a signal $V_{fb,hyst}$. Signal $V_{fb,hyst}$ is one example of signal 616 of FIG. 6. Comparator 708 compares signal $V_{fb,hyst}$ to $V_{ref}$, where $V_{ref}$ is equal to, or proportional to, a desired value of output voltage $V_{out}$. Comparator 708 asserts a first comparator output signal 720 when $V_{fb,hyst}$ exceeds $V_{ref}$. Accordingly, comparator 708 operates as a ripple-injection controller.

Balancing injection subsystem 706 generates a reference signal $V_{ref,eff}$ from a sum of (a) $V_{ref}$ and (b) an integral of a difference between an actual value of $V_x$ and $V_{x,nom}$, where $V_x$, nom is a nominal switching node voltage. Accordingly, nominal voltage generation block 602, subtractor block 604, and integrator and reset block 606 of FIG. 6 are collectively implemented by balancing injection subsystem 706, in the FIG. 7 embodiment. Additionally, reference signal $V_{ref,eff}$ is one example of signal 612 of FIG. 6. In this example, $V_x$, nom is approximately 25% of input voltage $V_{in}$ at input power node 132, but $V_{x,nom}$ may vary if hybrid SC converter 100 is modified to have a different number of flying capacitors or otherwise different topology. $V_{x,nom}$ is optionally generated within balancing injection subsystem 706 from either (a) $V_{in}$ or (b) from an average of switching node voltage $V_x$ values when switching node 147 is driven high, over multiple switching cycles. Comparator 710 compares $V_{fb,hyst}$ to $V_{ref,eff}$ and comparator 710 asserts a second comparator signal 722 when $V_{fb,hyst}$ exceeds $V_{ref,eff}$. Accordingly, comparator 710 is an embodiment of comparator 608 of FIG. 6, and comparator 710 reduces switching state duration when voltage $V_x$ is too low, i.e., when voltage $V_x$ crosses a threshold voltage equal to $V_{ref,eff}$ thereby effectively reducing charging/discharging switching state duration when negatively/positively connected flying capacitor voltages are too high/low.

Comparator 712 compares voltage $V_x$ to a reference signal $V_{x,min}$, where $V_{x,min}$, is a minimum threshold value for switching node 147 voltage. Comparator 712 asserts an unfiltered third comparator signal 724 when $V_x$ is less than $V_{x,min}$. Therefore, the instantaneous voltage $V_x$ may be used to control the switching state. The value of $V_{x,min}$ may be provided as a reference voltage to the controller or, like $V_{x,nom}$, may be determined as a fraction of the input voltage Vin, or may also be determined as an offset voltage from the $V_{x,nom}$ voltage. Further, the controller may adjust the value of $V_{x,min}$ based on the configuration of flying capacitors in a given switching state to compensate for differences in the Thevenin equivalent capacitance of flying capacitors electrically coupled to the inductor in the switching state.

Accordingly, the controller may adjust $V_{x,min}$ based on the number of flying capacitors in a given switching state; thus comparator 712 can be used to limit the duration of a switching state when an absolute voltage deviation of V, from nominal voltage $V_{x,nom}$ is detected. By adjusting $V_{x,min}$ based on the configuration of flying capacitors, this can be used to ensure a maximum voltage deviation of flying capacitors from their nominal voltage level or a maximum level of voltage stress on switching devices in the hybrid SC converter. AND gate 716 asserts a filtered third comparator signal 726 when (a) unfiltered third comparator signal 724 is asserted and (b) switching node 147 is not connected to ground. Accordingly, comparator 712 enables safe startup without a pre-charge circuit, and comparator 712 helps mitigate dynamic line and load conditions. OR gate 714 asserts a signal 728 when any one of first comparator signal 720, second comparator signal 722, and filtered third comparator signal 726 are asserted. FSM 718 generates control signals $S_{T,0}$, $S_{T,1}$, $S_{T,2}$, $S_{T,3}$, $S_{B,0}$, $S_{B,1}$, $S_{B,2}$ based on signal events and past state history, such as in a manner similar to that illustrated in FIG. 2, FIG. 3, or FIG. 4. FSM 718 is one example of control signal generation block 503.

To a first order, controller 700 operates like a hysteretic controller. If a measured (feedback) signal exceeds a system reference, as determined by one or more of comparators 708, 710, and 712, OR gate 714 asserts signal 728. When the measured (feedback) signals drop below a system reference (not necessarily the same reference), as determined by comparators 708, 710, and 714, OR gate 714 de-asserts signal 728. When signal 728 is asserted, FSM 718 will turn off all upper switching devices (102-108), and FSM 718 turns on all lower switching devices (110-116), connecting switching node 147 to reference node 134. At the rising edge of signal 728, the internal state of FSM 718 is shifted; this state then determines control signals that will be generated when signal 728 is de-asserted. In each state, exactly one top switching device 102-108 will be on, connecting switching node 147 to a nominal voltage of approximately $V_{IN}/4$.

Figure 8:
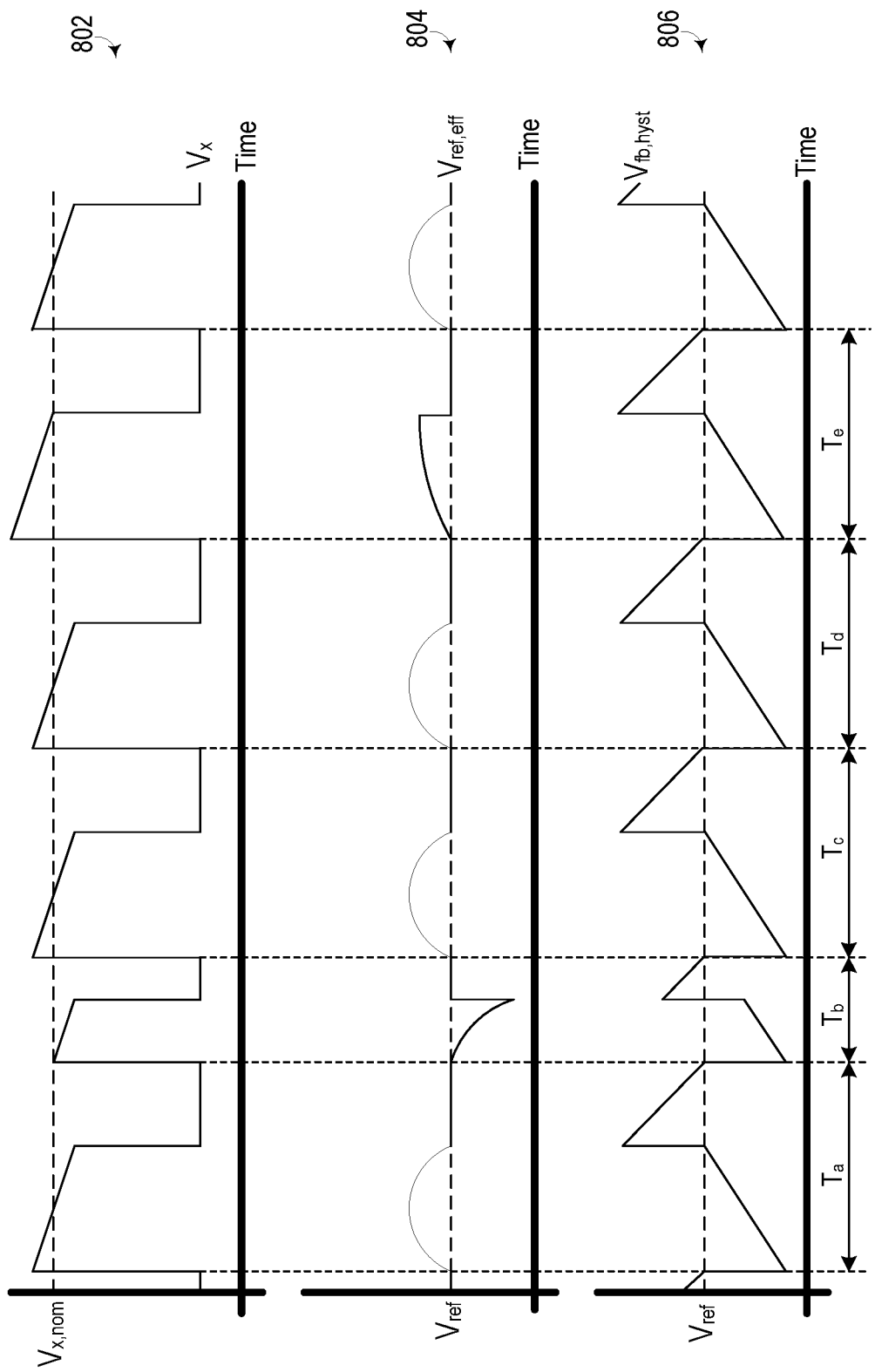
FIG. 8 includes three graphs illustrating example waveforms of an embodiment of the FIG. 1 hybrid SC converter including the FIG. 7 controller.
Figure 9:
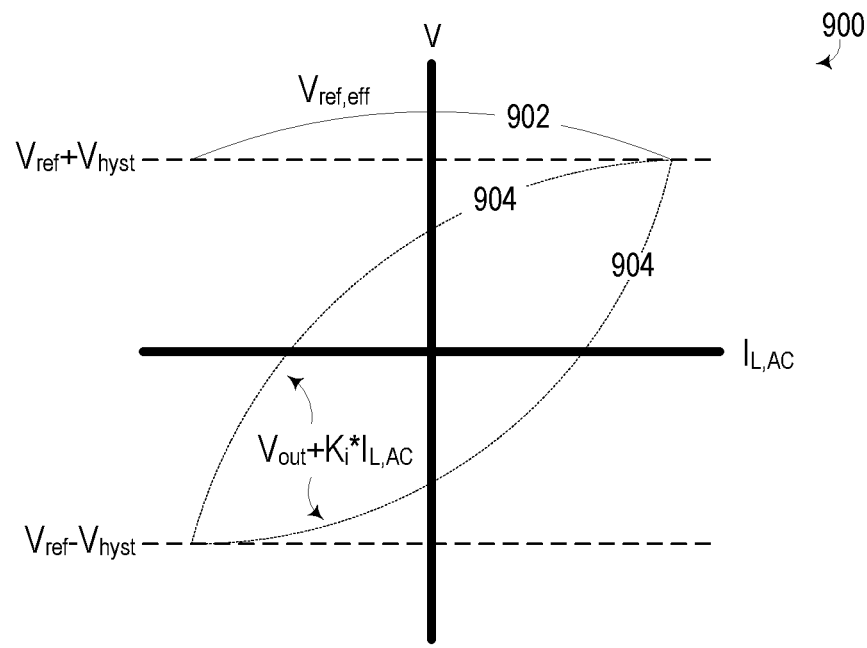
FIG. 9 is a state-plane representation of example control signals when flying capacitor voltage is balanced.

FIG. 8 includes three graphs 802, 804, and 806 illustrating example waveforms of an embodiment of hybrid SC converter 100 including controller 700. Graph 802 illustrates switching node voltage $V_x$ as a function of time, graph 804 illustrates $V_{ref,eff}$ as a function of time, and graph 806 illustrates $V_{fb,hyst}$ as a function of time. Flying capacitor voltage is balanced in switching cycles $T_a$, $T_c$, and $T_d$, and FIG. 9 is a state-plane 900 representation of control signals during switching cycles $T_a$, $T_c$, and $T_d$. FIG. 9 includes (a) a curve 902 representing the $V_{ref,eff}$ trajectory and (b) a curve 904 representing $V_{out}+K_i*I_{L,AC}$, where $I_{L,AC}$ is AC current flowing through inductor 126, and $K_1$ is a constant that is a function of $I_{L,AC}$. The flying capacitors discharge symmetrically around their peak-peak averaged value under balanced conditions, and the $V_{ref,eff}$ trajectory (switching threshold for comparator 710) is pseudo-parabolical, with start and end points exactly on the $V_{fb,hyst}$ curve, as illustrated in FIGS. 8 and 9.

Figure 10:
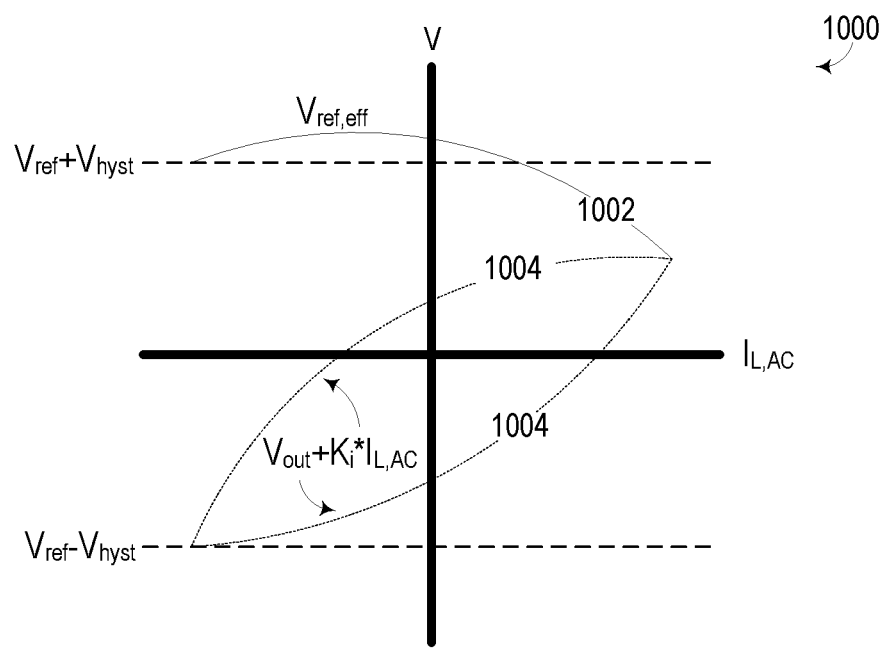
FIG. 10 is a state-plane representation of example control signals when flying capacitor voltage is unbalanced.

In switching cycle $T_b$, in contrast, switching node voltage $V_x$ is lower than nominal, such that flying capacitor voltage is unbalanced and the $V_{ref,eff}$ trajectory tips down. Consequently, controller 700 decreases switching state duration in switching cycle $T_b$, to adjust flying capacitor voltage towards balance. FIG. 10 is a state-plane 1000 representation of control signals during switching cycle $T_b$, including (a) a curve 1002 representing the $V_{ref,eff}$ trajectory and (b) a curve 1004 representing $V_{out}+K_i*I_{L,AC}$.

Figure 11:
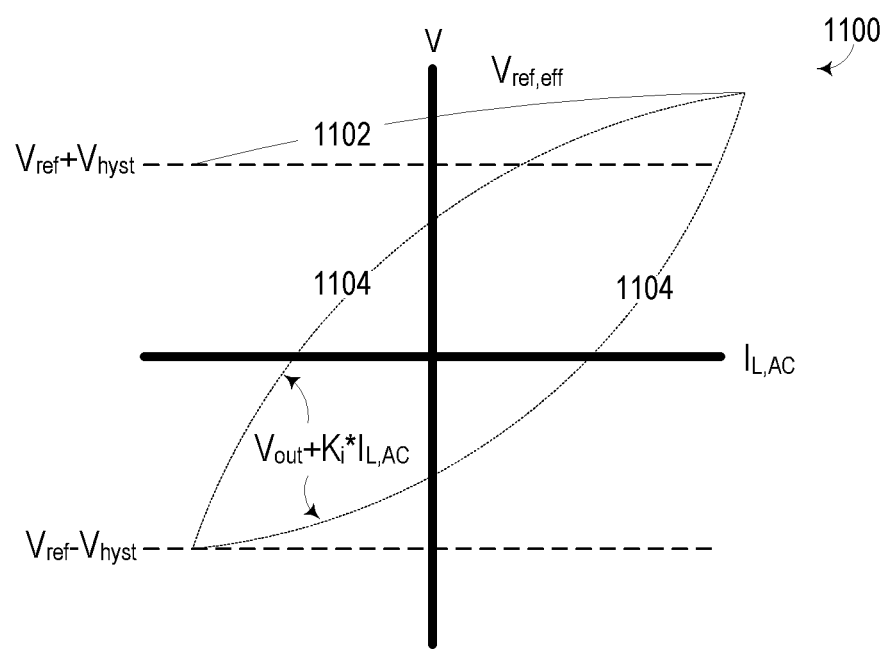
FIG. 11 is another state-plane representation of example control signals when flying capacitor voltage is unbalanced.

In switching cycle $T_e$, in turn, switching node voltage $V_x$ is greater than nominal, such that flying capacitor voltage is unbalanced and the $V_{ref,eff}$ trajectory tips up. FIG. 11 is a state-plane 1100 representation of control signals during switching cycle $T_e$, including (a) a curve 1102 representing the $V_{ref,eff}$ trajectory and (b) a curve 1104 representing $V_{out}+K_i*I_{L,AC}$. Increasing switching state duration in switching cycle $T_e$ adjusts flying capacitor voltage towards balance. However, increasing switching state duration also allows signal $V_{fb,hyst}$ to deviate further from its nominal value by expanding the hysteretic window in the state plane representation. Therefore, controller 700 only reacts to imbalance that causes a lower-than-nominal switching node voltage $V_x$. Since every flying capacitor can be in two states, each with opposing charge flow polarity, this configuration will maintain flying capacitor voltage balancing while regulating output voltage. In this case, controller 700 contracts the hysteretic window when switching node voltage $V_x$ is too low ($V_x<V_{x,nom}$), decreasing switching state duration. In extreme imbalance cases and during startup, where integration associated with $V_{ref,eff}$ causes too much delay, controller 700 switches directly at the $V_{x,min}$ threshold with comparator 712. Otherwise, controller 700 operates as a ripple injection controller using comparator 708.

Figure 12:
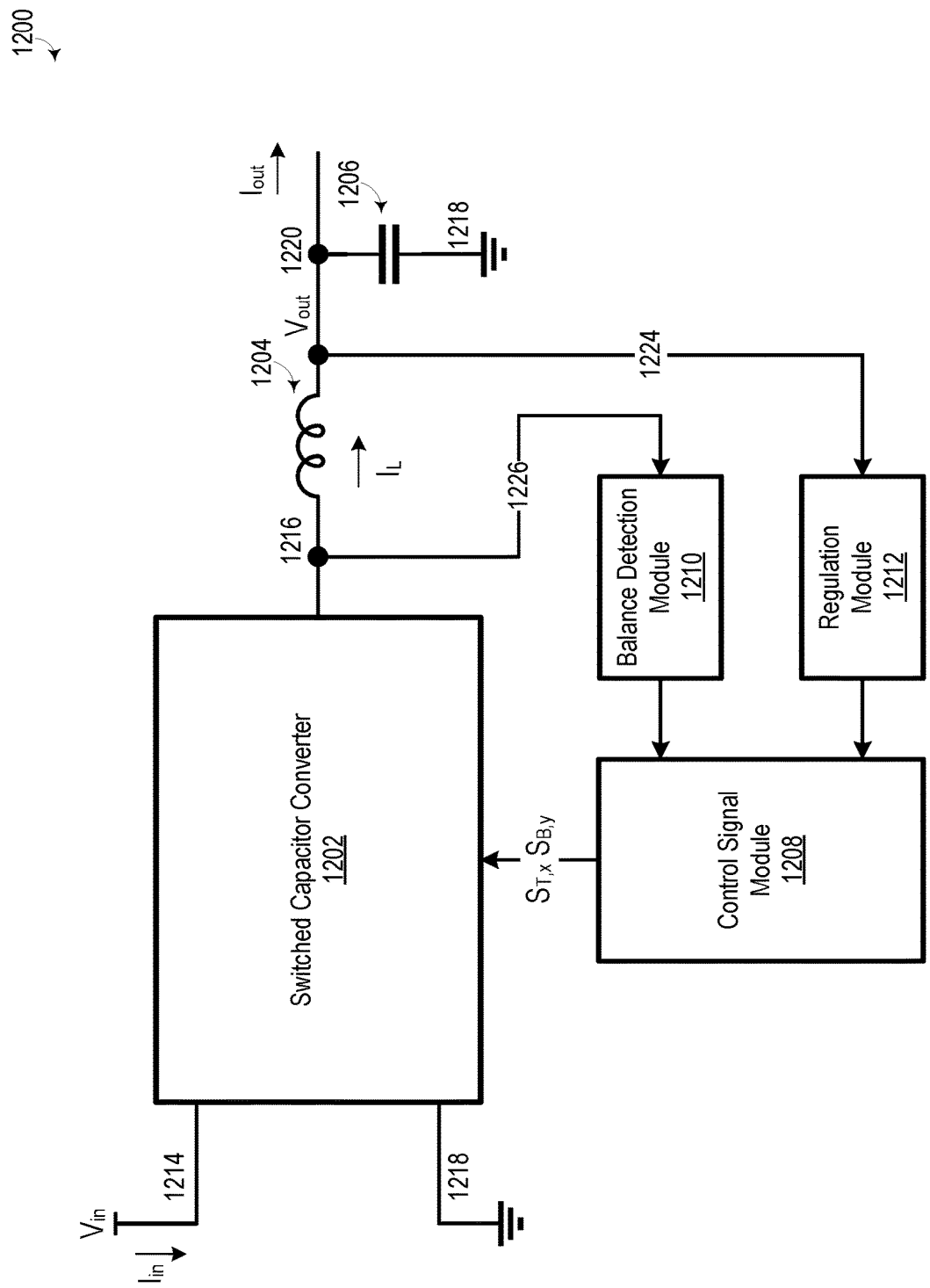
FIG. 12 is a schematic diagram illustrating another hybrid SC converter with real-time control of switching state duration, according to an embodiment.

The concepts disclosed herein are not limited to the example hybrid SC converter of FIG. 1. Instead, they can be applied to many other hybrid SC converters, including both hybrid SC converters with symmetrical topologies and hybrid SC converters with asymmetrical topologies. For example, FIG. 12 is a schematic diagram of a hybrid SC converter 1200, which illustrates how the concepts disclose herein could be applied broadly to essentially any hybrid SC converter. Hybrid SC converter 1200 includes a SC converter 1202, an inductor 1204, an output capacitor 1206, a control signal module 1208, a balance detection module 1210, and a regulation module 1212. Control signal module 1208, balance detection module 1210, and regulation module 1212 are formed, for example, of analog electronic circuitry and/or digital electronic circuitry. Two or more of control signal module 1208, balance detection module 1210, and regulation module 1212 could be combined without departing from the scope hereof.

SC converter 1202 is electrically coupled between an input power node 1214 and a switching node 1216, and SC converter 1202 is also electrically coupled to a reference node 1218. An input electrical power source (not shown) is optionally electrically coupled to input power node 1214. Inductor 1204 is electrically coupled between switching node 1216 and an output power node 1220, and output capacitor 1206 is electrically coupled between output power node 1220 and reference node 1218. A load (not shown) is optionally electrically coupled to output power node 1220.

Control signal module 1208 is configured to generate control signals ST,x for upper switching devices (not shown) of SC converter 1202 and control signals SB,y for lower switching devices (not shown) of SC converter 1202, where (a) x ranges from 0 to N−1, (b) N is the number of upper switching devices of SC converter 1202, (c) y ranges from 0 to M−1, and (d) M is the number of lower switching devices of SC converter 1202. M need not be equal to N. In some embodiments, each control signal SB,y is complementary to at least one of control signals ST,x, although there may be deadtime between switching states where control signals that are typically complementary are both de-asserted. It should be noted that the terms "upper switching device" and "lower switching device" are terms of convenience and need not imply a particular location in a circuit topology. For example, an upper switching device could be connected to a reference node, and a lower switching device could be connected to an input power node. Control signal module 1208 is configured to generate control signals ST,x and SB,y using, for example, a pulse width modulation (PWM) technique, where control signal pulse width is modulated to control operation of hybrid SC converter 1200, such as by using a voltage-mode control technique or a current-mode control technique.

Regulation module 1212 monitors one or more parameters of hybrid SC converter 1200, and regulation module 1212 causes control signal module 1208 to generate control signals ST,x and SB,y in a manner which regulates the monitored parameter(s) of hybrid SC converter 1200. FIG. 12 illustrates regulation module 1212 including a feedback path 1224 for sensing magnitude of an output voltage $V_{out}$ at output power node 1220, but regulation module 1212 could be configured to sense one or more parameters in addition to, or in place of, output voltage $V_{out}$ magnitude. Regulation module 1212 could be configured to regulate one or more of magnitude of an input voltage ($V_{in}$) at input power node 1214, magnitude of input current $I_{in}$ flowing into hybrid SC converter 1200, and magnitude of output current $I_{out}$ flowing out of hybrid SC converter 1200, in addition to, or in place of magnitude of $V_{out}$. While certain embodiments of the regulation module 1212 implement nonlinear-type control methods such as hysteretic or sliding mode control, regulation module 1212 is not limited to these embodiments. Module 1212 can also easily embody linear control methods such as variations of proportional, integral, derivative (PID) control such as ramp modulator plus comparator. Such methods may operate with a fixed frequency pulse-width-modulation (PWM) circuit based on analog or digital circuitry and which is well known in the art.

Balance detection module 1210 is configured to cause control signal module 1208 to vary switching state duration to help maintain flying capacitor voltage balance in SC converter 1202, e.g. on a switching-cycle by switching-cycle basis. For example, in certain embodiments, control signal module 1208 and balance detection module 1210 are collectively configured to generate control signals $S_{T,x}$ and $S_{B,y}$ to perform one or more of the following control techniques on a switching cycle-by-switching cycle basis: (a) increase a duration of a discharging switching state in response to a flying capacitor voltage being too high, (b) decrease a duration of a charging switching state in response to a flying capacitor voltage being too high, (c) increase a duration of a charging switching state in response to a flying capacitor voltage being too low, and (d) decrease a duration of a discharging switching state in response to a flying capacitor voltage being too low. In some embodiments where control module 1208 is configured to generate control signals ST,x using PWM, balance detection module 1210 is configured to cause control module 1208 to vary time when one or more control signals ST,x are de-asserted, thereby varying switching state duration, to promote flying capacitor voltage balance.

In some embodiments, balance detection module 1210 is configured to detect flying capacitor voltage imbalance based on a comparison of (a) a signal that is function of an average flying capacitor voltage and (b) a reference signal. The signal that is a function of the average flying capacitor voltage is, for example, average flying capacitor voltage, average switching node voltage, an integral of flying capacitor voltage across a time interval, an integral of a switching node voltage across a time interval, an integral of a difference between actual flying capacitor voltage and nominal flying capacitor voltage across a time interval, or an integral of a difference between actual switching node voltage and nominal switching node voltage across a time interval. For example, in some embodiments, balance detection module 1210 is configured to use techniques similar to those discussed above with respect FIG. 5 or 6 to cause control signal module 1208 to vary switching state duration to promote flying capacitor voltage balance. Although FIG. 12 illustrates balance detection module 1210 sensing switching node voltage $V_x$ via a feedback path 1226, balance detection module 1210 could be configured to sense one or more alternative or additional parameters, such as voltage across a flying capacitor of SC converter 1202.

Figure 13:
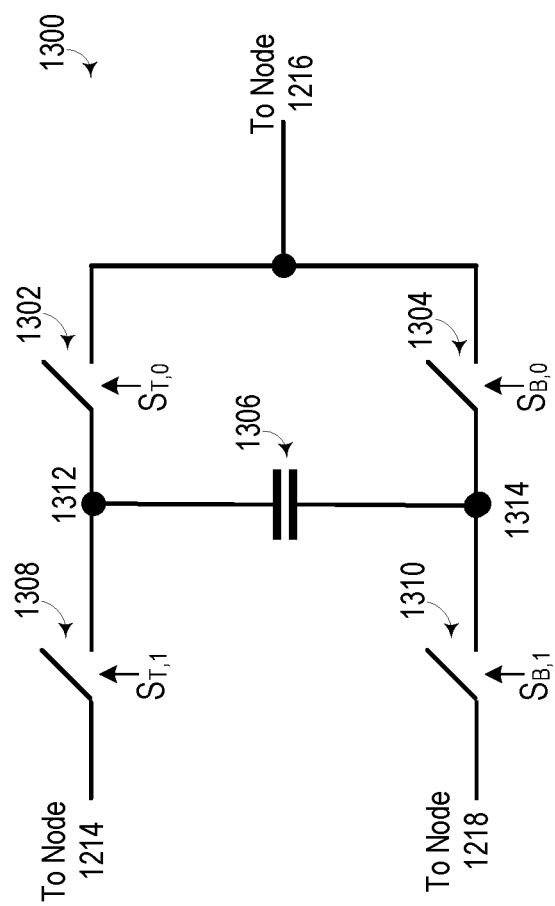
FIG. 13 is a schematic diagram of a SC converter, according to an embodiment.

FIG. 13 is a schematic diagram of a SC converter 1300, which is one possible embodiment of SC converter 1202 of FIG. 12. SC converter 1300 includes an upper switching device 1302, a lower switching device 1304, a flying capacitor 1306, an upper switch 1308, and a lower switch 1310. Upper switching device 1302 is electrically coupled between switching node 1312 and switching node 1216, and lower switching device 1304 is electrically coupled between reference node 1314 and switching node 1216. Flying capacitor 1306 is electrically coupled between switching node 1312 and reference node 1314. Upper switching device 1302 is controlled by control signal $S_{T,0}$ from control signal module 1208, and lower switching device 1304 is controlled by control signal $S_{B,0}$ from control signal module 1208. Upper switch 1308 is connected between node 1312 and input power node 1214, and bottom switch 1310 is connected between reference node 1314 and reference node 1218. Upper switch is controlled by $S_{T,1}$ from control signal module 1208 and bottom switch 1310 is controlled by signal $S_{B,1}$ from signal module 1208.

Figure 14:
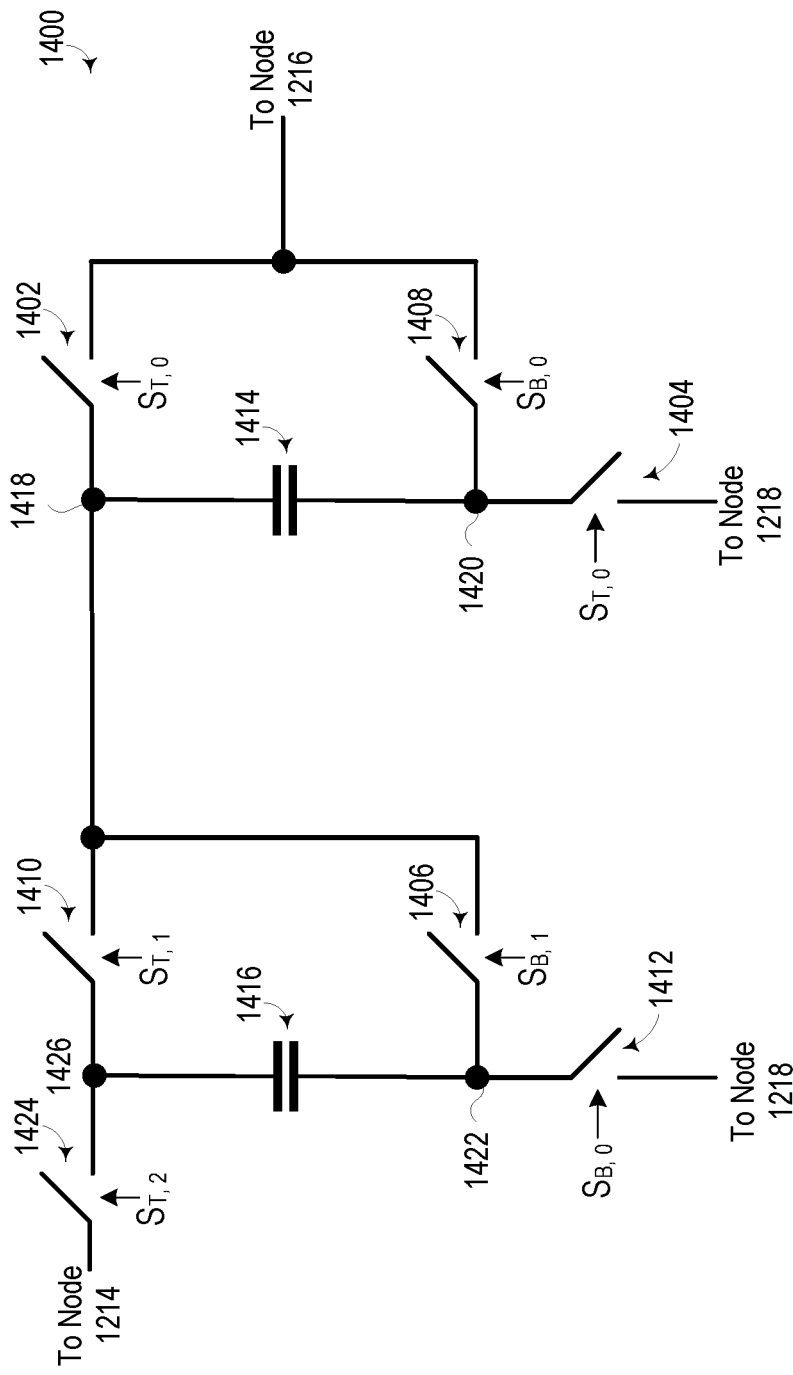
FIG. 14 is a schematic diagram of one embodiment of the FIG. 13 SC converter having a two-level Fibonacci topology.

SC converter 1300 could be modified by adding switching devices and/or flying capacitors to have essentially an unlimited number of possible topologies, including, but not limited to, a Dickson topology, a series-parallel topology, a flying capacitor multi-level (FCML) topology, a Fibonacci topology, or a cascade doubler topology. For example, FIG. 14 is a schematic diagram of a SC converter 1400, which is one embodiment of SC converter 1300 modified to have a two-level Fibonacci topology. SC converter 1400 includes an upper switching device 1402, an upper switching device 1404, an upper switching device 1410, an upper switching device 1424, a lower switching device 1406, a lower switching device 1408, a lower switching device 1412, a flying capacitor 1414, and a flying capacitor 1416. Upper switching device 1402 is electrically coupled between an intermediate node 1418 and switching node 1216, and upper switching device 1404 is electrically coupled between an intermediate node 1420 and reference node 1218. Upper switching device 1410 is electrically coupled between node 1426 and intermediate node 1418, upper switch 1424 is electrically coupled between input power node 1214 and intermediate node 1426, and lower switching device 1408 is electrically coupled between intermediate node 1420 and switching node 1216. Lower switching device 1406 is electrically coupled between intermediate nodes 1418 and 1422, and lower switching device is 1412 is electrically coupled between intermediate node 1422 and reference node 1218. Upper switching devices 1402, 1404, 1410, and 1424 are respectively controlled by control signals $S_{T,0}$, $S_{T,0}$, $S_{T,1}$, and $S_{T,2}$ from control signal module 1208, and lower switching devices 1406, 1408, and 1412 are respectively controlled by control signals $S_{B,1}$, $S_{B,0}$, and $S_{B,0}$ from control signal module 1208.

Figure 15:
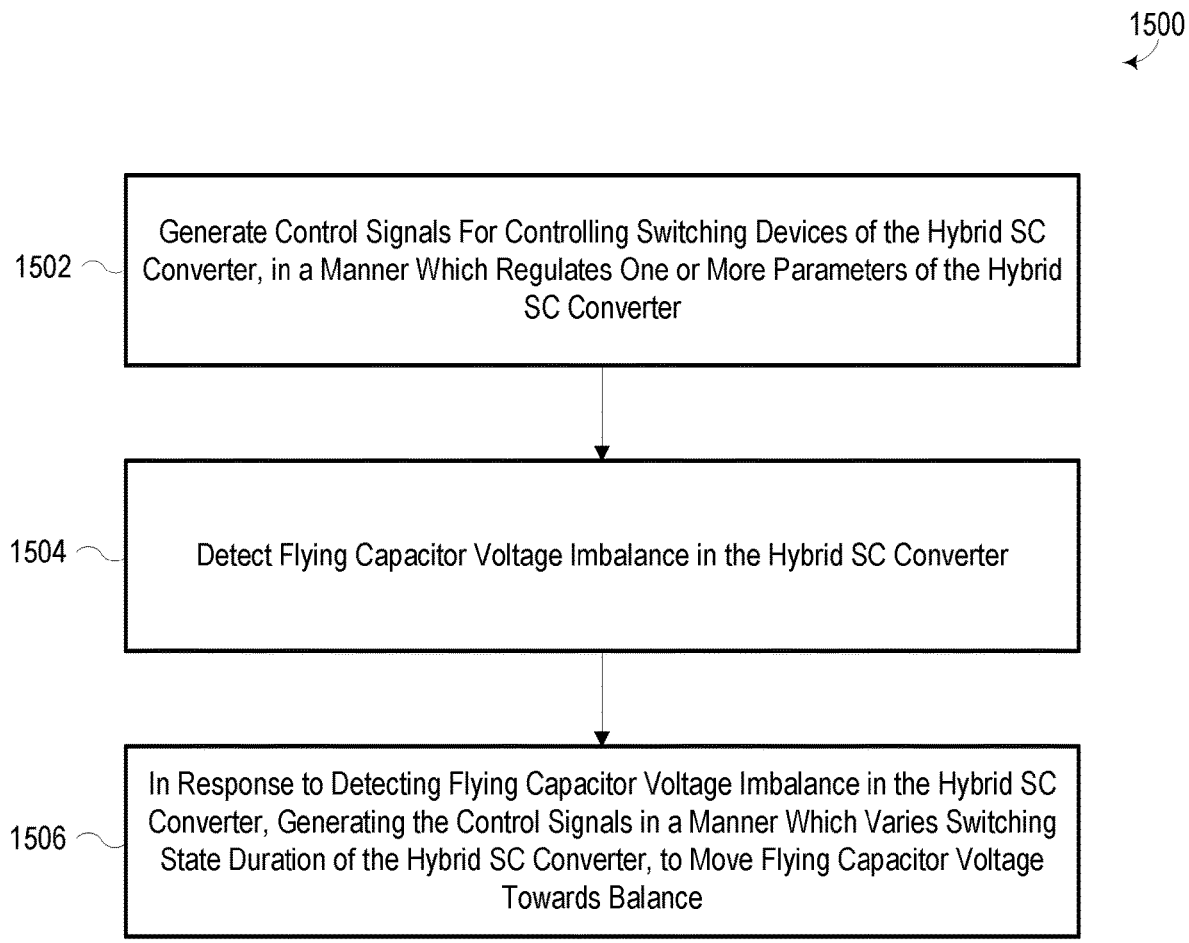
FIG. 15 is a flow chart illustrating a method for controlling a hybrid SC converter, according to an embodiment.

FIG. 15 is a flow chart illustrating a method 1500 for controlling a hybrid SC converter. In a block 1502, control signals for controlling switching devices of the hybrid SC converter are generated in a manner which regulates one or more parameters of the hybrid SC converter. In one example of block 1502, controller 130 (FIG. 1) generates control signal $S_{T,0}$, $S_{T,1}$, $S_{T,2}$, $S_{T,3}$, $S_{B,0}$, $S_{B,1}$, $S_{B,2}$, and $S_{B,3}$ to respectively control switching devices 102-110, in a manner which regulates magnitude of output voltage $V_{out}$. In another example of block 1502, control signal module 1208 and regulation module 1212 (FIG. 12) collectively generate control signals $S_{T,x}$ and $S_{B,y}$ to control switching devices of SC converter 1202, in a manner which regulates magnitude of output voltage $V_{out}$.

In a block 1504 of method 1500, flying capacitor voltage imbalance is detected in the hybrid SC converter. In one example of block 1504, controller 130 (FIG. 1) detects flying capacitor voltage imbalance from either voltage across one or more of flying capacitors 120-124, or from voltage at switching node 147. In another example of block 1504, balance detection module 1210 (FIG. 12) detects flying capacitor voltage imbalance from either voltage across one or more flying capacitors of SC converter 1202, or from voltage at switching node 1216. In a block 1506 of method 1500, control signals are generated in a manner which varies switching state duration of the hybrid SC converter to move flying capacitor voltage toward balance, in response to detecting flying capacitor voltage imbalance in the hybrid SC converter. In one example of block 1506, controller 130 (FIG. 1) generates control signal $S_{T,0}$, $S_{T,1}$, $S_{T,2}$, $S_{T,3}$, $S_{B,0}$, $S_{B,1}$, $S_{B,2}$, and $S_{B,3}$ in a manner which changes switching state duration, such as illustrated in switching cycle $T_e$ of FIG. 3 or switching cycle $T_e$ of FIG. 4. In another example of block 1506, control signal module 1208 and balance detection module 1210 (FIG. 12) collectively generate control signals $S_{T,x}$ and $S_{B,y}$ in a manner which varies switching state duration of the hybrid SC converter.

Figure 16:
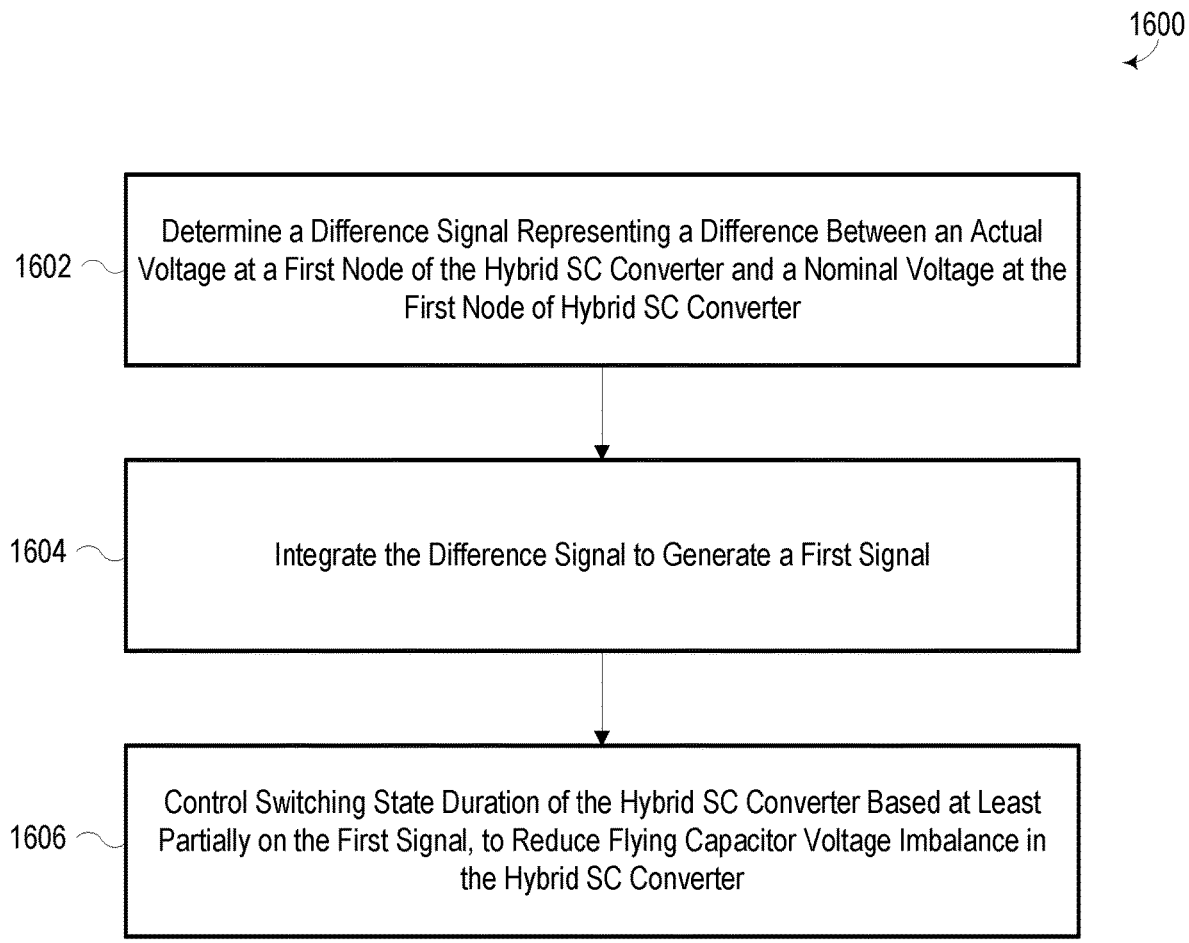
FIG. 16 is a flow chart illustrating another method for controlling a hybrid SC converter, according to an embodiment.

FIG. 16 is a flow chart illustrating a method 1600 for controlling a hybrid SC converter. In a block 1602, a difference signal is determined, where the difference signal represents a difference between an actual voltage at a first node of the hybrid SC converter and a nominal voltage at the first node of the hybrid SC converter. In one example of block 1602, subtractor block 604 (FIG. 6) generates difference signal 610. In a block 1604, the difference signal is integrated to generate a first signal. In one example of block 1604, integrator and reset block 606 (FIG. 6) integrates difference signal 610, and adds output reference voltage 614 to the result, to generate a signal 612. In a block 1606, switching state duration is controlled based at least partially on the first signal, to reduce flying capacitor voltage imbalance in the hybrid SC converter. In one example of block 1606, comparator 608 (FIG. 6) asserts switching state transition signal 510 in response to a value of signal 612, which includes an integral of difference signal 610, crossing a value of signal 616.

Figure 17:
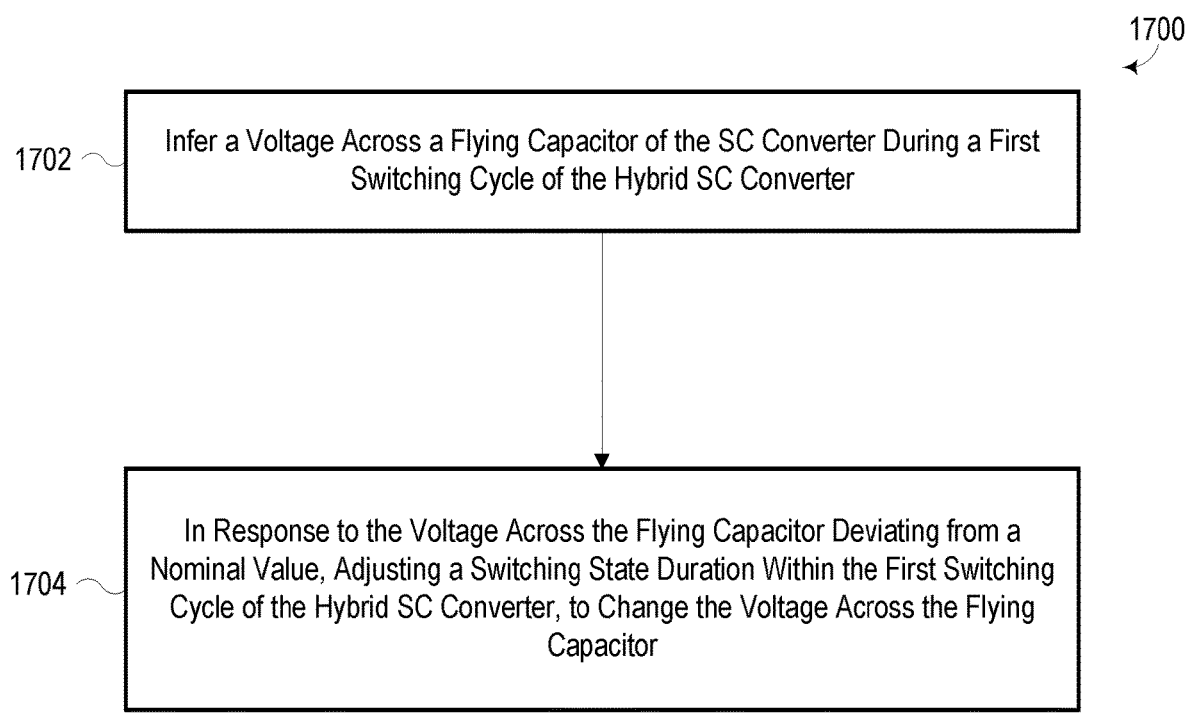
FIG. 17 is a flow chart illustrating another method for controlling a hybrid SC converter, according to an embodiment.

FIG. 17 illustrates another method 1700 for controlling a hybrid SC converter. In a block 1702, a voltage across a flying capacitor of the SC converter is inferred during a first switching cycle of the hybrid SC converter. In one example of block 1702, controller 130 (FIG. 1) infers a voltage across one or more of flying capacitors 120-124 from voltage $V_x$ at switching node 147, such as using one or more of the techniques discussed with respect to FIGS. 5 and 6. In another example of block 1702, balance detection module 1210 (FIG. 12)) infers a voltage across one or more of flying capacitors of SC converter 1202 from voltage at switching node 1216.

In a block 1704, a switching state duration within the first switching cycle is adjusted to change the voltage across the flying capacitor, in response to the voltage across the flying capacitor deviating from a nominal value. In one example of block 1704, controller 130 reduces duration of a switching state during switching cycle $T_e$ of FIG. 3, in response to flying capacitor voltage being lower than a nominal value. In another example of block 1704, controller 130 increases duration of a switching state during switching cycle $T_e$ of FIG. 4, in response to flying capacitor voltage being higher than a nominal value. In another example of block 1704, balance detection module 1210 and control signal module 1208 collectively generate control signals $S_{T,x}$ and $S_{B,y}$ in a manner which varies switching state duration of hybrid SC converter 1202.

Changes may be made in the above converters, controllers, and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present converters, controllers, and methods, which, as a matter of language, might be said to fall therebetween.

What is claimed is:

1. A method for controlling a hybrid switched capacitor (SC) converter having a plurality of flying capacitors, comprising:
    generating control signals for controlling a switching state of switching devices of the hybrid SC converter, in a manner which regulates one or more parameters of the hybrid SC converter;
    detecting flying capacitor voltage imbalance in the hybrid SC converter by comparing (a) a signal that is a function of voltage across a flying capacitor of the plurality of flying capacitors of the hybrid SC converter and (b) a reference signal, wherein a value of the reference signal is determined in part by a configuration of the plurality of flying capacitors; and
    generating subsequent control signals in a manner in which the switching state is terminated upon detection of flying capacitor imbalance and advancing to a next switching state to move flying capacitor voltage towards balance.

2. The method of claim 1, wherein the signal that is a function of the voltage across the flying capacitor during a switching state of the hybrid SC converter is at least partially based on a voltage at a switching node of the hybrid SC converter, the switching node electrically joining at least one switching device of the hybrid SC converter and an inductor of the hybrid SC converter.

3. The method of claim 1, wherein value of the reference signal represents a threshold corresponding to a maximum desired deviation of the flying capacitor voltage from a nominal voltage.

4. The method of claim 3, wherein the signal that is a function of the voltage across the plurality of flying capacitors is at least partially based on an integral of a switching node voltage across a time interval, the switching node electrically joining at least one switching device of the hybrid SC converter and an inductor of the hybrid SC converter.

5. The method of claim 1, wherein the signal that is a function of voltage across a flying capacitor is based on a switching node electrically joining a switching device and an inductor in a switching state when the switching node is not connected to ground, the reference signal represents a desired maximum deviation of the signal that is a function of the voltage across a flying capacitor during the switching state, and the subsequent control signals are generated in a manner in which the switching state is terminated when the signal that is a function of the voltage across a flying capacitor crosses the reference signal.

6. The method of claim 5, wherein the signal that is a function of voltage across a flying capacitor is based on an integral of a switching node voltage across a time interval, and the reference signal represents a desired maximum deviation of the integral of the switching node voltage across a time interval during the switching state, and control signals are generated in a manner in which the switching state is terminated when the signal that is a function of the voltage across a flying capacitor crosses the reference signal.

* * * * *